(12) United States Patent
Eccleston

(10) Patent No.: US 7,402,852 B2
(45) Date of Patent: Jul. 22, 2008

(54) CHARGE COUPLED DEVICE HAVING A BACK ELECTRODE

(75) Inventor: William Eccleston, Merseyside (GB)

(73) Assignee: The University of Liverpool, Liverpool (GB)

( * ) Notice: Subject to any disclaimer, the term of this patent is extended or adjusted under 35 U.S.C. 154(b) by 0 days.

(21) Appl. No.: 10/585,160

(22) PCT Filed: Dec. 16, 2004

(86) PCT No.: PCT/GB2004/005268

§ 371 (c)(1),
(2), (4) Date: May 30, 2007

(87) PCT Pub. No.: WO2005/064704

PCT Pub. Date: Jul. 14, 2005

(65) Prior Publication Data

US 2007/0284569 A1  Dec. 13, 2007

(30) Foreign Application Priority Data

Dec. 30, 2003 (GB) ................... 0330134.8

(51) Int. Cl.
H01L 29/768 (2006.01)
H01L 27/095 (2006.01)

(52) U.S. Cl. ............... 257/249; 257/476; 257/E27.068; 257/E29.148

(58) Field of Classification Search ............... 257/249, 257/476, E27.068, E29.148
See application file for complete search history.

(56) References Cited

U.S. PATENT DOCUMENTS

| 4,207,477 | A |  | 6/1980 | Esser |
| 4,561,005 | A | * | 12/1985 | Shannon ................ 257/28 |
| 4,746,622 | A | * | 5/1988 | Hawkins et al. .......... 438/144 |
| 5,063,417 | A |  | 11/1991 | Hopfield |
| 5,179,428 | A | * | 1/1993 | Lee ....................... 257/233 |
| 5,598,016 | A | * | 1/1997 | Tanabe et al. ............ 257/229 |
| 5,635,738 | A | * | 6/1997 | Shoda et al. ............. 257/225 |
| 5,804,836 | A |  | 9/1998 | Heeger et al. |
| 6,864,111 | B2 | * | 3/2005 | Yu et al. ................. 438/22 |
| 2004/0016923 | A1 | * | 1/2004 | Yu et al. ................. 257/49 |

FOREIGN PATENT DOCUMENTS

| EP | 0 486 141 A2 | 5/1992 |
| JP | 2003-282854 A | 10/2003 |
| WO | WO 99/39372 | 8/1999 |
| WO | WO 99/39394 | 8/1999 |
| WO | WO 01/94980 A1 | 12/2001 |
| WO | WO 02/063631 A1 | 8/2002 |

* cited by examiner

Primary Examiner—Ngan Ngo
(74) Attorney, Agent, or Firm—Blakely, Sokoloff, Taylor & Zafman; Stephen M. De Klerk

(57) ABSTRACT

A charge coupled device (CCD) is disclosed which has a semiconductor body (20) comprising polymer or oligomer semiconductor material in place of the conventional silicon. A back electrode (22) of the device is electrically coupled to the semi-conductor body through a Schottky junction, reducing the availability of holes in the semiconductor body. Shift electrodes forming a shift register are driven by negative electrical potentials and accumulations of holes in p type semiconductor material represent data.

19 Claims, 5 Drawing Sheets

CHARGE COUPLED DEVICE HAVING A BACK ELECTRODE

CROSS-REFERENCE TO OTHER APPLICATIONS

This is a National Phase of International Application No. PCT/GB2004/005268, filed on Dec. 16, 2004, which claims priority from Great Britain Patent Application No. 0330134.8, filed on Dec. 30, 2003.

BACKGROUND OF THE INVENTION

The present invention relates to charge coupled devices (CCDs).

Charged coupled devices based upon conventional silicon semiconductor technology are well known. The inventor has recognized that it would be desirable to fabricate CCDs using polymer semiconductor material. One reason for this is that the potential range of polymer based electronic products includes devices which require at least some memory. It is desirable in polymer based devices to minimize the number of interconnect lines, which will be a key yield factor with polymer based circuits in the near future, and CCDs are attractive from this point of view. They can also be very compact although this is less crucial in polymer based devices with their large area capability.

Conventional (silicon based) CCDs utilize an inversion layer in the semiconductor to store data but this approach is impractical with at least some polymer or oligomer semiconductors.

SUMMARY OF THE INVENTION

An object of the present invention is to provide a charge coupled device using polymer or oligomer semiconductor material.

In accordance with a first aspect of the present invention there is a charge coupled device (CCD) comprising a semiconductor body, a set of storage electrodes separated from the semiconductor body by a dielectric, and a back electrode, wherein the semiconductor body comprises polymer or oligomer material and the back electrode forms a Schottky junction with the semiconductor body by virtue of which the semiconductor body is depleted of majority charge carriers, so that when in use the storage electrodes are charged such as to attract the majority charge carriers, they create storage sites in the semiconductor body which can take either of a first state, in which there is an accumulation of majority charge carriers at the site, and a second state, in which such an accumulation is not present at the site.

Hence where the device serves as a register or memory, it is majority charge accumulation which serves to encode data, rather than inversion as in conventional CCDs. It might be expected that in a device operating by accumulation the lifetime of the second state would be unacceptably short, since the mobility of majority charge carriers in polymers and oligomers is typically sufficiently high. This problem is addressed by provision of the Schottky junction at the back electrode and the consequent depletion of majority carriers in the semiconductor body. The lifetime of the resulting second state is finite (as it is in a conventional CCD). In the present device majority carriers can be injected into the semiconductor body from the back electrode, but this effect is tolerably small because the Schottky junction is biased against carrier flow in this direction. As a result the lifetime of the second state is compatible with device function. It is found that despite the presence of the Schottky back electrode junction, application of suitable electrical potential to the storage electrodes creates in the body potential wells suitable to receive and retain majority charge carrier accumulations.

In typical embodiments the device further comprises shift electrodes arranged between storage electrodes and separated from the semiconductor body by a dielectric, by means of which charge can be moved from one storage site in the semiconductor body to another.

Preferably the back electrode is disposed on one side of the semiconductor body and the storage electrodes are disposed on the opposite side.

In the preferred construction the semiconductor body is a thin layer at one face of which is the back electrode and at the other face of which are the storage electrodes and their associated dielectric. The semiconductor depth in such a construction can be such that the region of majority charge carrier depletion created by the said Schottky junction extends through the full depth of the semiconductor body.

Preferably the Schottky junction provides a potential barrier to injection of majority charge carriers to the semiconductor body which is 10 kT or greater, where K is Boltzmann's constant and T is the device's intended operating temperature in degrees Kelvin. T may be taken to be 300 Kelvin.

A conjugated polymer or oligomer material is preferred.

A typical device embodying the present invention further comprises a data input structure comprising an input electrode arranged adjacent a storage site in the semiconductor body to cause injection of majority charge carriers thereto.

In one such embodiment the input electrode forms a Schottky junction with the semiconductor body and the data input structure further comprises a transfer electrode adjacent the input electrode, such that applying to the transfer electrode a charge opposite to that of the majority charge carriers in the semiconductor body causes injection of majority charge carriers to a potential well formed in the semiconductor body by the transfer electrode. Such an arrangement is well suited to serial input of data to a CCD serving as a register or stack.

In another such embodiment data is encoded by provision of input electrodes adjacent to selected storage electrodes, so that upon initialization an accumulation of holes is injected to the storage sites corresponding to the selected storage electrodes and not to others. This type of construction is well suited to applications where data is permanently encoded in the device so that it provides a read only memory function. The input electrodes may be connected to a common electrical line so that the device is initialized by applying an electrical potential to the line in order to drive majority charge carriers into the selected storage sites.

With current polymer materials p type polymer or oligomer material is favored for the semiconductor body, the device being adapted to be driven by application of negative potentials to the storage electrodes creating sites for hole accumulation in the semiconductor body.

Preferably alternating storage and shift electrodes are arranged to form a line along which majority charge carrier accumulations are passed in use. The line of electrodes may be addressed through first and second electric shift lines and preferably comprises a series of electrode pairs each comprising a lower field shift electrode electrically connected to an adjacent higher field storage electrode, alternate such electrode pairs being electrically connected to the first and second shift lines respectively, such that by changing from time to time which of the shift lines is at greater electrical potential, accumulations of majority charge carriers are passed along the line of electrodes.

The storage and/or shift electrodes may be formed by a plurality of localized metal layers which are anodized to form the dielectric by which they are isolated from the semiconductor body. The semiconductor body may comprise a layer of polymer or oligomer deposited over the metal layers.

In accordance with a second aspect of the present invention there is a method of manufacturing a charge coupled device comprising forming upon a substrate a first localized metal layer to serve as a first set of electrodes, anodising the first metal layer to form an oxide layer upon it;

forming a second localized metal layer to serve as a second set of electrodes, anodising the second layer to form an oxide layer upon it;

forming over the metal layers a semiconductor body of polymer or oligomer material and forming upon the semiconductor body a metal back electrode, the material of the back electrode and of the semiconductor body being such that together they form a Schottky junction by virtue of which the semiconductor body is depleted of majority charge carriers.

BRIEF DESCRIPTION OF THE DRAWINGS

Specific embodiments of the present invention will now be described, by way of example only, with reference to the accompanying drawings in which:—

DETAILED DESCRIPTION OF THE INVENTION

Figure 1:
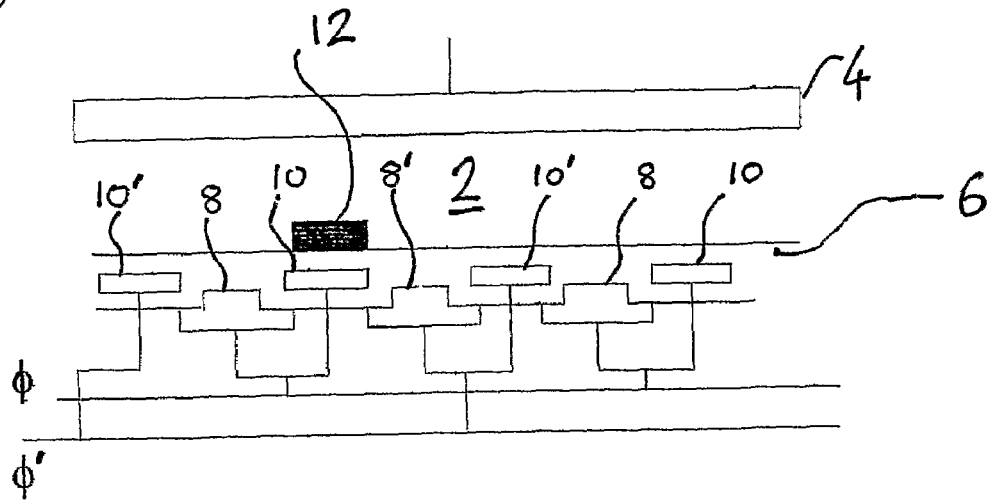
FIG. 1 represents in schematic form a section through a charge coupled device of existing type.

In the conventional CCD of FIG. 1, p type silicon semiconductor material 2 is sandwiched between a back contact 4, which forms an ohmic contact to the semiconductor, and a dielectric oxide layer 6. Beneath the oxide surface, and so insulated from the semiconductor, are shift electrodes 8, 8' and storage electrodes 10, 10', the latter being closer to the semiconductor than the former. Connections to the electrodes are made through first and second lines $\phi$ and $\phi'$. In the illustration, data flows in the direction toward the right hand side.

Alternate shift electrodes 8 are connected to the first line $\phi$. To the right of each of these shift electrodes is a storage electrode 10 which is also connected to the first line $\phi$. Remaining shift electrodes 8' are connected to the second line $\phi'$ and to the right of each of these shift electrodes is a storage electrode 10' which is also connected to the second line $\phi'$. If a positive potential is applied to any of the electrodes it serves to create, in an adjacent region of the semiconductor, a potential well in which electrons can be stored. Hence in FIG. 1 (relating to a conventional device based on p type silicon) a slug of electrons forming a localized inversion is seen at 12 in the vicinity of a particular electrode 10 and represents a logic "1", while the absence of a corresponding inversion in the vicinity of the other upper electrodes represents logic "0"s. Thus a register is formed for storage of digital data but this storage is "dynamic" in the sense that the data can only be stored for a finite time. This is because the p type silicon is capable of generating electron-hole pairs and the electrons are attracted to the positive potentials existing below regions representing logic "0"s. The corresponding holes leave the semiconductor via the back contact. Over time all "0"s are thereby converted to "1"s—that is, an inversion layer forms in the vicinity of each electrode. Storage times for the best silicon CCDs are of the order of milliseconds.

To appreciate how data is shifted along the register, consider the situation illustrated in FIG. 1 wherein the first line $\phi$ is initially at a positive potential with the second line $\phi'$ at lower potential, the slug 12 of electrons being thus attracted to the adjacent storage electrode 10, which, because it has a thin dielectric separating it from the silicon, creates a high field in it. If a sufficiently large positive pulse is then applied to the second line $\phi'$ then the related semiconductor surface potential draws the electrons to the right, firstly to the adjacent shift electrode 8' and then (since it creates a larger field) to the storage electrode 10'. In this way all of the data in the register is shifted simultaneously one place to the right. Returning the second line $\phi'$ to its original lower potential causes the electrons and the data again to move to the right and the shift process can thus be repeated by applying and removing the high potential on second line $\phi'$. Thus by suitable "clocking" of the electrode potentials data can be caused to move along the array.

In practice a typical CCD comprises a square array of electrodes and data passes in serpentine fashion down the array. One data bit is represented by an adjacent set of four electrodes—two shift electrodes 8, 8' and two storage electrodes 10, 10'—so that even if the data comprises a series of logic "1"s, this is represented by a series of inversions over storage electrodes 10' with no inversions over the intermediate electrodes 10. This separation of the inversion regions ensures that during the shift process an "empty" storage electrode is always available to capture the incoming bit. Other methods of change transfer are possible and the arrangement of electrodes correspondingly differs from one device to another.

Implementing a CCD which uses a polymer semiconductor in place of the conventional silicon is challenging. The best performing polymer semiconductors are typically p type. It is not possible to utilize an inversion layer to store data in such materials, however, (as in the silicon based CCD) because in typical polymers the electrons which would be required to form the inversion are immobile. There is the alternative of storing data by use of an accumulation layer but this too is problematic since holes forming an accumulation layer in p type polymers tend to be too mobile, more so even than those in the body of the polymer. If the type of device illustrated in FIG. 1 were adapted to function in this way, replacing the silicon with p type semiconductor and applying negative potentials to the electrodes to create a negative polymer surface potential, a functional CCD would not result. Due to their high mobility, holes would very rapidly accumulate in the potential wells created by the electrodes and all locations in the device would, in an unacceptably short space of time, change to the logic "1" state.

Figure 2:
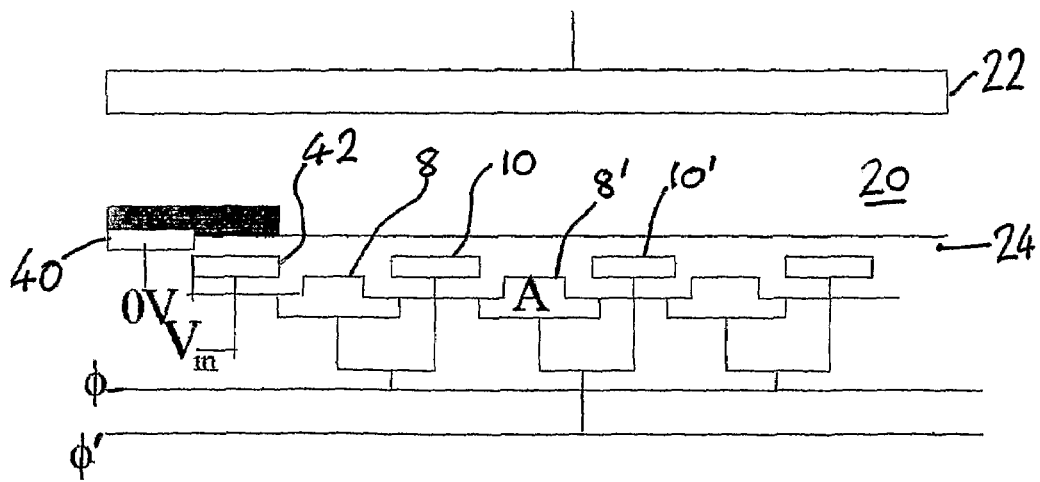
FIG. 2 represents in schematic form a section through a charge coupled device embodying the present invention.

FIG. 2 illustrates a CCD constructed in accordance with the present invention. A body of polymer semiconductor material 20 is sandwiched between back contact 22 and dielectric (oxide) layer 24 and in this example is a p type material. The polymer material chosen for this embodiment is poly-3-hexylthiophene. Other polymer (or oligomer) materials may be used. The back contact 22 of the FIG. 2 embodiment does not form on an ohmic contact with the semiconductor 20. Instead it forms a Schottky barrier. In the present embodiment this is achieved by selecting aluminum for the back contact. Other metal/polymer combinations could be used, as the skilled person will recognize. For instance other polythiophenes may be used. The Schottky junction creates a depletion (space-charge) region within the adjacent semiconductor. The concentration of charge carriers (holes, in the present example) is reduced to a very low value in the depletion region, which extends through the full depth of the semiconductor. The Schottky junction is also biased against injection of holes into the semiconductor. The result is that the rate of supply of holes into the potential wells at the semiconductor/dielectric junction is reduced by several orders of magnitude.

The main part of the register utilizes an electrode arrangement of the type already described with reference to the conventional CCD of FIG. 1, with paired shift and storage electrodes 8, 10 and 8', 10'. As before, the register electrodes along with the oxide layer and semiconductor effectively form MOS (metal/oxide/semiconductor) capacitors. In the FIG. 2 device, however, the potentials applied to the electrodes are negative. A logic "1" is represented by an accumulation of holes at a given location in the register. A logic "0" is represented by the absence of such accumulation. By virtue of the Schottky barrier at the metal/semiconductor junction of the back contact and the consequent reduction in hole availability, the lifetime of a "0" state is sufficiently long to allow a functional device to be created.

Figure 3:
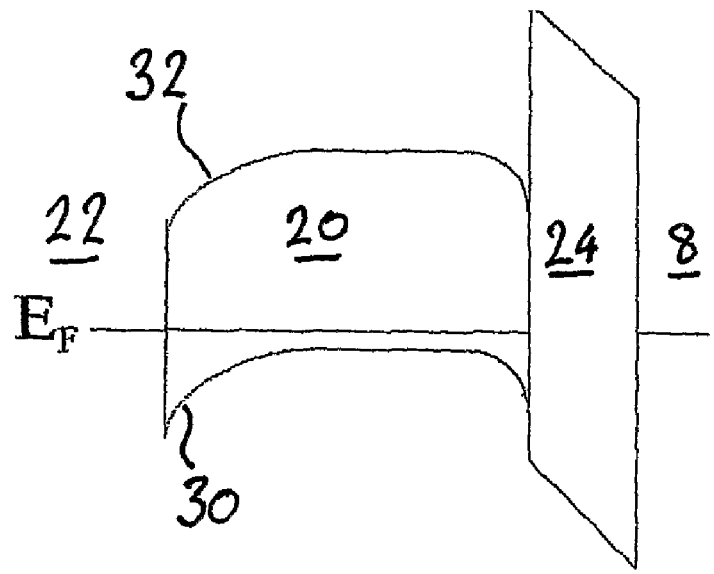
FIGS. 3 and 4 are band diagrams relating to the device illustrated in FIG. 2.
Figure 4:
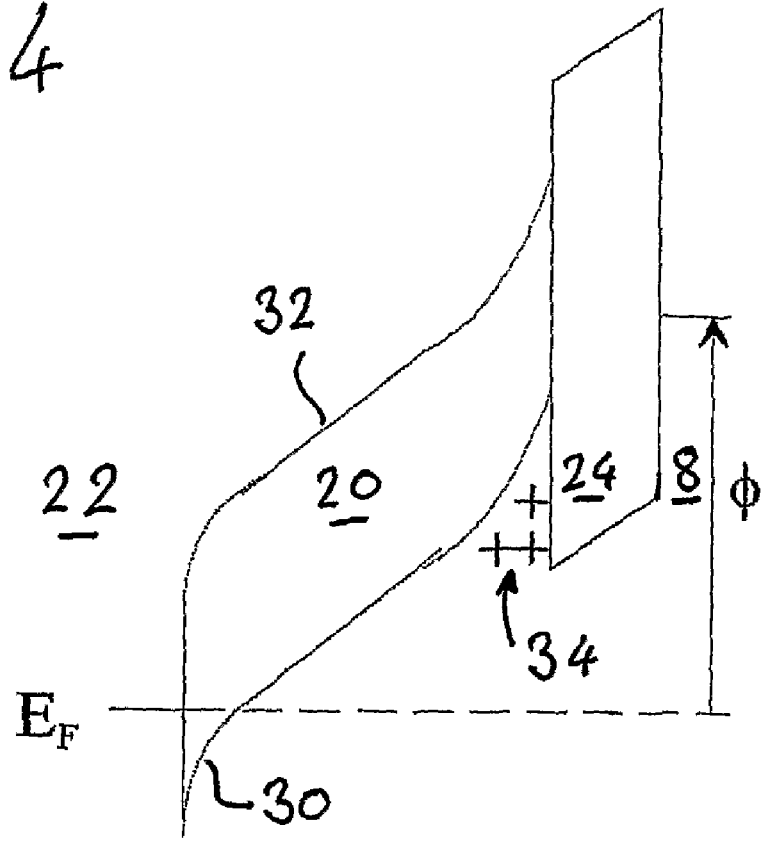

FIGS. 3 and 4 are band diagrams for the FIG. 2 device with regions representing the back contact 22, polymer 20, dielectric 24 and metal electrodes 8. The upper edge of the conduction band and lower edge of the valence band are indicated at 30 and 32 respectively, and the Fermi level is represented by a line $E_F$. Comparing FIG. 3, which shows the situation with zero field applied by the electrodes 8, against FIG. 4, which represents the case where electrodes 8 provide a negative electric field, it can be appreciated that the effect of an applied field is to create, in a region 34 of the polymer adjacent the dielectric layer 24, a potential well for holes. The potential barrier to injection of holes from the back contact is also seen at the polymer/back contact interface.

Figure 5:
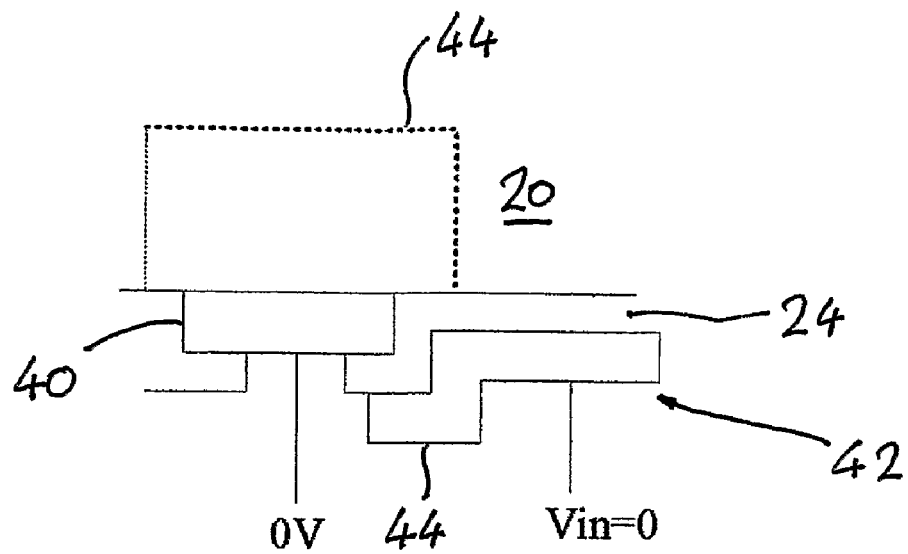
FIGS. 5 and 6 are schematic sections through an arrangement of electrodes used for data input in the device of FIG. 2.
Figure 6:
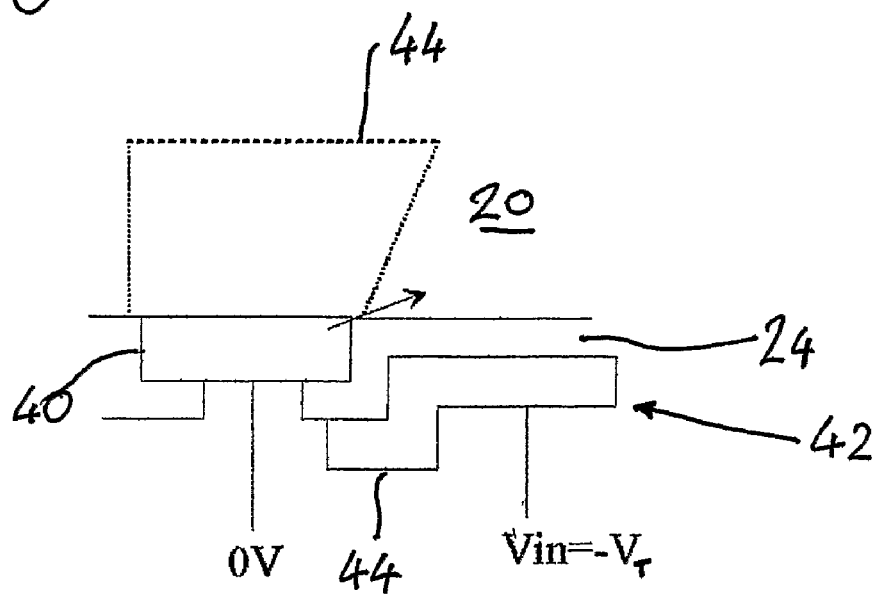

It is necessary to provide for input of data to the shift register. The relevant arrangement is seen in simplified form in FIG. 2 and in more detail in FIGS. 5 and 6, in which the polymer semiconductor body is again labelled 20 and the dielectric layer is 24. A metal input electrode 40 is provided at one end of the register, being arranged in the oxide layer but in contact with the polymer material 20, and so forming with the polymer a Schottky diode. The input electrode 40 has 0V applied. Adjacent to it is a transfer electrode 42, seen in FIGS. 5 and 6 to have a lower limb 44 extending beneath the input electrode. A potential $V_{in}$, applied to the transfer electrode 42 is varied between zero and a negative potential $-V_T$, in synchronism with the clocking of the shift register, to write data. FIG. 5 shows the situation when $V_{in}=0$. Dotted region 44 is the depletion region around the Schottky diode. In this state holes are not transferred to the vicinity of the transfer electrode and a logic "0" is written. FIG. 6 shows the situation when $V_{in}=-V_T$. The depletion region 44 is reduced in size in the vicinity of the input electrode to the point where holes can tunnel into the region above the transfer electrode 42, writing a logic "1". The holes then transfer into the register automatically as it is clocked.

A Schottky diode, arranged at the end far end of the register from the input structure and formed in similar manner to it, is used to read data from the register. A clock pulse is applied to the metal electrode of the reader diode and logic "1" is recognized as a current flow out of this electrode, logic "0" being recognized by the absence of such current.

Figure 7:
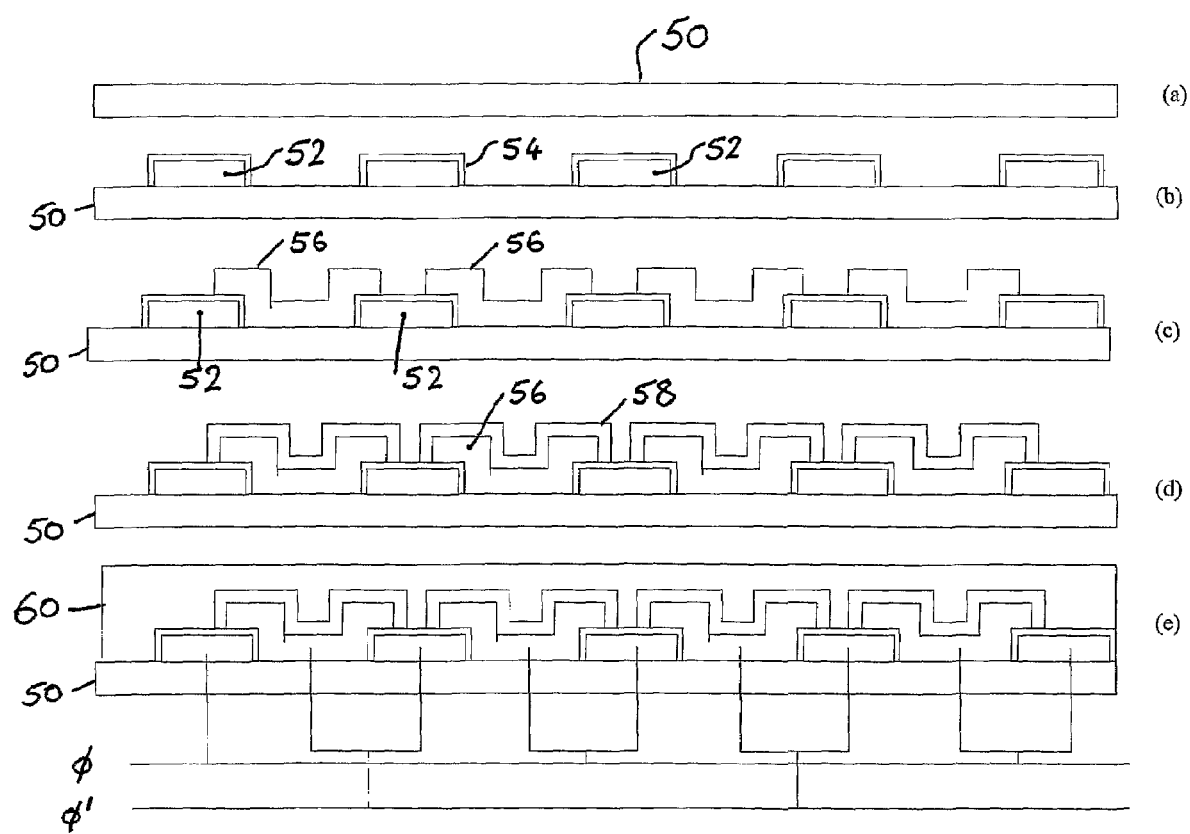
FIGS. 7a-e are schematic sections through the same device at successive stages in its manufacture.

FIGS. 7*a-e* illustrate the steps involved in manufacture of the polymer based CCD. This process begins with a substrate formed in this case as a cleaned plastics sheet 50. Aluminium is evaporated onto the substrate, photoengraved to form stripe electrodes 52, and then the metal surface anodized to form a high K dielectric (alumina) layer 54. A second aluminium layer is then deposited and a further set of stripe electrodes 56 is defined in it, each of the further electrodes 56 sitting between, but overlapping, adjacent first electrodes 52 on either side (FIG. 7*c*). The further electrodes 56 are then anodized to form a second oxide layer 58 which is much thicker than the first. Electrical connections to the different sets of electrodes can be made on the substrate on opposite sides of the array. Polymer 60 is applied by spin coating, casting or printing (FIG. 7*c*). Lines 62 and 64 represent in schematic form the connections to the electrodes although these connections lie outside the plane of the diagram.

Figure 8:
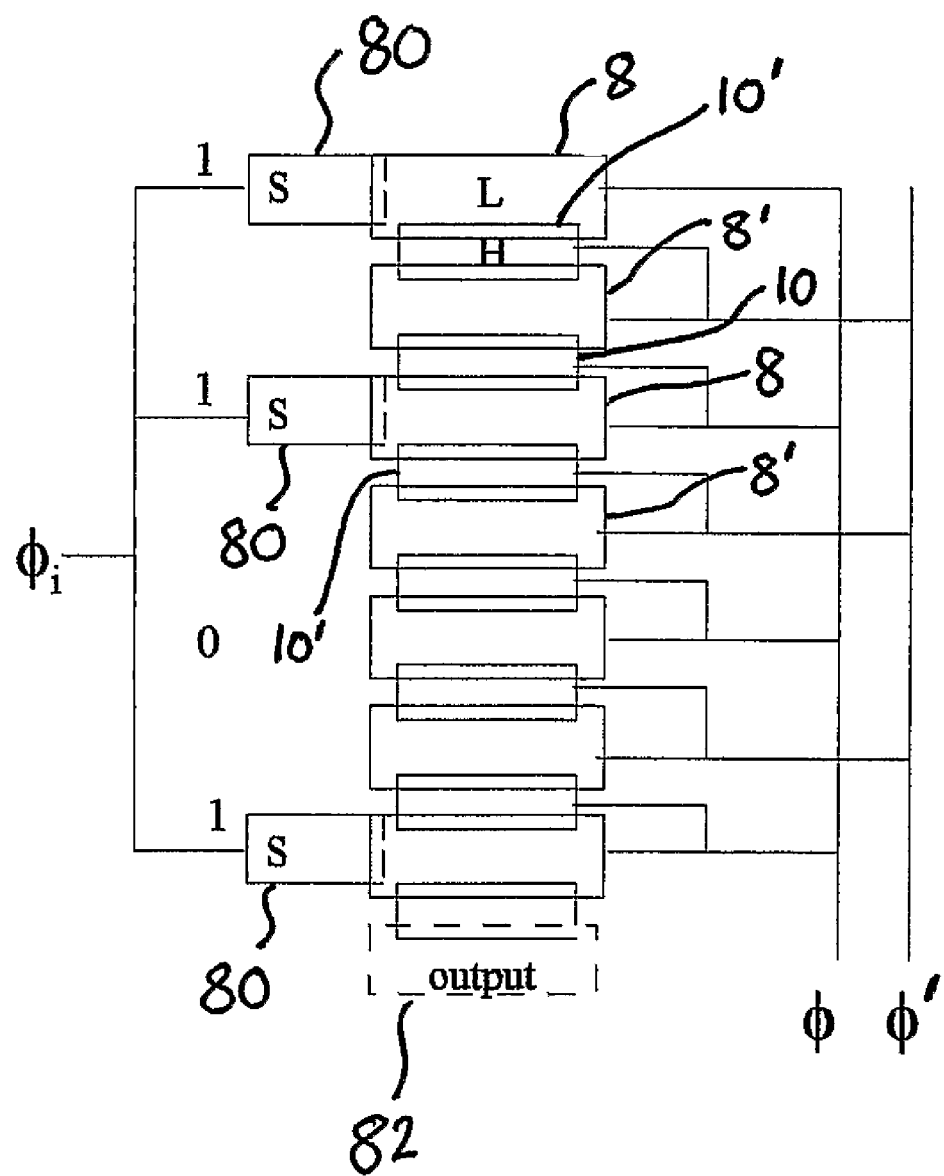
FIG. 8 is a schematic illustration of a further device embodying the present invention, viewed along a direction perpendicular to the device substrate.

The embodiment described above is essentially a register or "stack" which allows data to be input serially and subsequently output serially. CCDs can serve other purposes, however. FIG. 8 illustrates a CCD constructed in accordance with the present invention which serves as a read only memory. The device is seen in plan (i.e. along a direction perpendicular to the substrate). Shift and storage electrodes are once more designated 8, 8' and 10, 10' respectively and are connected in the same pattern as before to electric lines φ and φ'. However in place of the serial data input arrangement illustrated in FIGS. 5 and 6, the memory of FIG. 8 has a set of write contacts 80 associated with selected shift electrodes 8. The write contacts 80 are overlapped by their corresponding shift electrodes and may form ohmic or Schottky contacts. To read data permanently stored by the device, it is first initialized by application of a voltage pulse to all of the write contacts 80 through an input line $\phi_i$ which drives charge carriers (in the present embodiment, holes) into the polymer below the selected shift electrodes 8, from where it passes to the vicinity of the adjacent storage electrode 10 and there represents a logic "1," condition. Where no write contact 80 is provided no charge accumulation takes place and the corresponding storage electrode 10 carries a logic "0". By clocking lines φ and $\phi^1$ as before, the relevant binary number (1101 in the illustrated example) can be read through a serial output 82 as before.

The polymer based CCD of the present invention has numerous potential applications. One example is in the field of electromagnetically readable tags, whose economical manufacture from polymer materials is highly attractive commercially. An identification code could be stored in such a tag by a ROM of the type illustrated in FIG. 8.

The above embodiments serve as examples only and should not be taken to be limiting upon the scope of the invention. For example while only p type devices are discussed above, the present invention is potentially applicable to n type devices in which the Schottky junction formed by the back electrode serves to deplete the semiconductor body of mobile electrons.

What is claimed is:

1. A charge coupled device (CCD) comprising a semiconductor body, a set of storage electrodes separated from the semiconductor body by a dielectric, and a back electrode, wherein the semiconductor body comprises polymer or oligomer material and the back electrode forms a Schottky junction with the semiconductor body by virtue of which the semiconductor body is depleted of majority charge carriers, so that when in use the storage electrodes are charged such as to attract the majority charge carriers, they create storage sites in the semiconductor body which can take either of a first state, in which there is an accumulation of majority charge carriers at the site, and a second state, in which such an accumulation is not present at the site.

2. A CCD as claimed in claim 1 which further comprises shift electrodes arranged between storage electrodes and separated from the semiconductor body by a dielectric, by means of which charge can be moved from one storage site in the semiconductor body to another.

3. A CCD as claimed in claim 1 wherein the back electrode is disposed on one side of the semiconductor body and the storage electrodes are disposed on the opposite side.

4. A CCD as claimed in claim 1 wherein the semiconductor body is a thin layer at one face of which is the back electrode and at the other face of which are the storage electrodes and their associated dielectric.

5. A CCD as claimed in claim 4 wherein the region of majority charge carrier depletion created by the said Schottky junction extends through the full depth of the semiconductor body.

6. A CCD as claimed in claim 1 wherein the said Schottky junction provides a potential barrier to injection of majority charge carriers to the semiconductor body which is 10kT or greater, where K is Boltzmann's constant and T is the device's intended operating temperature in degrees Kelvin.

7. A CCD as claimed in claim 1 wherein the back electrode is metal.

8. A CCD as claimed in claim 1 wherein the polymer or oligomer material is conjugated.

9. A CCD as claimed in claim 1 wherein the semiconductor body comprises poly-3-hexylthiophene.

10. A CCD as claimed in claim 1 which further comprises a data input structure comprising an input electrode arranged adjacent a storage site in the semiconductor body to cause injection of majority charge carriers thereto.

11. A CCD as claimed in claim 10 wherein the input electrode forms a Schottky junction with the semiconductor body and the data input structure further comprises a transfer electrode adjacent the input electrode, such that applying to the transfer electrode a charge opposite to that of the majority charge carriers in the semiconductor body causes injection of majority charge carriers to a potential well formed in the semiconductor body by the transfer electrode.

12. A CCD as claimed in claim 10 in which data is encoded by provision of input electrodes adjacent to selected storage electrodes, so that upon initialization an accumulation of holes is injected to the storage sites corresponding to the selected storage electrodes and not to others.

13. A CCD as claimed in claim 12 wherein the input electrodes are connected to a common electrical line so that the device is initialized by applying an electrical potential to the line in order to drive majority charge carriers into the selected storage sites.

14. A CCD as claimed in claim 1 wherein the semiconductor body comprises p type material and is adapted to be driven by application of negative potentials to the storage electrodes creating sites for hole accumulation in the semiconductor body.

15. A CCD as claimed in claim 1 wherein alternating storage and shift electrodes arc arranged to form a line along which majority charge carrier accumulations are passed in use.

16. A CCD as claimed in claim 15 wherein the line of electrodes is addressed through first and second electric shift lines and comprises a series of electrode pairs each comprising a lower field shift electrode electrically connected to an adjacent higher field storage electrode, alternate such electrode pairs being electrically connected to the first and second shift lines respectively, such that by changing from time to time which of the shift lines is at more negative electrical potential, accumulations of majority charge carriers are passed along the line of electrodes.

17. A CCD as claimed in claim 1 wherein the shift electrodes are formed by a plurality of localized metal layers which are anodized to form an oxide layer which is the dielectric by which they are isolated from the semiconductor body.

18. A CCD as claimed in claim 17 wherein the semiconductor body comprises a layer of polymer or oligomer deposited over the metal layers.

19. A CCD as claimed in claim 1 connected to clocking circuitry which applies clocked negative potentials to the storage electrodes.

* * * * *